(12) United States Patent
Sinapi et al.

(10) Patent No.: US 8,206,788 B2
(45) Date of Patent: Jun. 26, 2012

(54) METHOD FOR TREATING A DAMAGED POROUS DIELECTRIC

(75) Inventors: Fabrice Sinapi, Courcelles (BE); Jan Alfons B. Van Hoeymissen, Heverlee (BE)

(73) Assignee: IMEC, Leuven (BE)

( * ) Notice: Subject to any disclaimer, the term of this patent is extended or adjusted under 35 U.S.C. 154(b) by 872 days.

(21) Appl. No.: 11/824,818

(22) Filed: Jul. 3, 2007

(65) Prior Publication Data

US 2008/0241499 A1   Oct. 2, 2008

(30) Foreign Application Priority Data

Mar. 26, 2007 (JP) ................. 2007-078635

(51) Int. Cl.
   *B05D 3/10* (2006.01)
(52) U.S. Cl. ........ 427/344; 427/301; 427/337; 427/341; 427/343; 438/623; 438/761; 438/762; 438/763; 438/778; 438/779; 438/780; 438/781; 438/787
(58) Field of Classification Search ........... 427/337, 427/140, 301, 340, 341, 343, 344, 532, 534; 438/623, 761, 762, 763, 778, 779, 780, 781, 438/787, 789, 790
   See application file for complete search history.

(56) References Cited

U.S. PATENT DOCUMENTS

| | | | | |
|---|---|---|---|---|
| 6,921,727 B2 * | 7/2005 | Chiang et al. | ............ | 438/778 |
| 2003/0003715 A1 * | 1/2003 | Hong | ............ | 438/637 |
| 2004/0018717 A1 * | 1/2004 | Fornof et al. | ............ | 438/624 |
| 2005/0095840 A1 * | 5/2005 | Bhanap et al. | ............ | 438/623 |
| 2005/0196974 A1 * | 9/2005 | Weigel et al. | ............ | 438/780 |
| 2006/0081273 A1 * | 4/2006 | McDermott et al. | ............ | 134/26 |

FOREIGN PATENT DOCUMENTS

WO    WO 03/077032    9/2003

OTHER PUBLICATIONS

Poole, Colin F., "The Essence of Chromatography," Elsevier, 571 (2002).
Poole, Colin F., "The Essence of Chromatography," Figure 1, Elsevier, p. 571 (2002).

* cited by examiner

*Primary Examiner* — Michael Cleveland
*Assistant Examiner* — Alexander Weddle
(74) *Attorney, Agent, or Firm* — McDonnell Boehnen Hulbert & Berghoff LLP

(57) ABSTRACT

In the manufacture of electronic devices that use porous dielectric materials, the properties of the dielectric in a pristine state can be altered by various processing steps. In a method for restoring and preserving the pristine properties of a porous dielectric layer, a substrate is provided with a layer of processed porous dielectric on top, whereby the processed porous dielectric is at least partially exposed. A thin aqueous film is formed at least on the exposed parts of the processed porous dielectric. The exposed porous dielectric with the aqueous film is exposed to an ambient containing a mixture comprising at least one silylation agent and dense $CO_2$, resulting in the restoration and preservation of the pristine properties of the porous dielectric.

19 Claims, 5 Drawing Sheets

METHOD FOR TREATING A DAMAGED POROUS DIELECTRIC

BACKGROUND

The present invention relates to the field of semiconductor processing, more specific to the field of low-κ dielectric repair after chemical mechanical polishing or plasma processing.

With advancements in ultra large-scale integration (ULSI), integrated microelectronic device dimensions are being scaled down and new challenges are defined for both front-end-of-line (FEOL) and back-end-of-line (BEOL) processing. The low-κ dielectric materials have been introduced to improve interconnects performance, more specific to reduce the resistance-capacitance (RC) delay. These materials are insulators with a dielectric constant κ lower than the κ-value for silicon dioxide (~4.0-4.2).

Recently with the advancements towards the 45 nm technology node high porosity low-κ materials with a κ-value lower than 2.5, known as ultra low-κ (ULK) materials have been introduced as interlayer dielectric. Next to many advantages they introduce also some important challenges in semiconductor fabrication: e.g. processes like plasma etch or plasma ashing, chemical mechanical polishing (CMP) and some cleaning chemistries may affect their properties.

At first, in order to protect these ULK materials during CMP, they were usually covered by a dielectric protection layer, which was partly polished during the CMP step. Nowadays, direct CMP, the approach without a dielectric protection layer is an important route to improve performance. As a consequence the absence of a dielectric protection layer results in damage of the underlying ULK dielectric material due to its direct exposure during CMP.

For instance, there is an increased discrepancy between the κ-values of the processed ULK dielectrics and the as-deposited ones, the processed dielectrics having higher κ-values. This observation has been attributed to the presence of moisture and adsorbed chemicals (slurries, cleaning solutions, etc.) penetrating the porous network during the CMP process.

Therefore before going to the next processing step, the κ-value should be restored as much as possible to its pristine (as-deposited) value and the surface of the ULK material should be stabilized/sealed in order to prevent further moisture and/or contamination uptake.

Thermal treatments are known to recover the as-deposited κ-value of a porous dielectric, but they are not completely recovering the hydrophobicity or stabilizing the surface. As a consequence, the restored κ-value is increasing again after several days.

Silylation processes in liquid solvents with organic molecules (silylation agents) are capable to restore hydrophobicity, but these treatments end-up with κ-values still too high with respect to the pristine ones.

Treatments with mixtures of silylation agents and supercritical $CO_2$ are known from the related field of plasma damage repair disclosed by Toma et al. in WO03/077032. They disclose treating a low-κ surface with a silylation agent in supercritical $CO_2$ to passivate the silanol groups on the surface. Their method restores hydrophobicity, but fails to offer a solution for the ageing behavior of the processed dielectric. Degradation/ageing of the restored properties of the porous dielectric can still take place e.g. due to adsorption of moisture and/or organic contamination in the bulk. Moreover working with supercritical $CO_2$ requires difficult experimental conditions like high temperatures and high pressures and any simplification of these experimental conditions would be of great benefit.

SUMMARY

Various objects of the methods described in the present disclosure are: to provide a method to restore the as-deposited properties of a processed porous dielectric; to provide a method to prevent the degradation (ageing) of the restored properties of a processed porous dielectric; to form a sealing layer on the exposed parts of the processed porous dielectric; to use a silylation process in dense $CO_2$ at room temperature; and to provide a semiconductor device comprising a processed porous dielectric, whereby the porous dielectric is prevented against ageing of its properties.

A method is disclosed for restoring and preserving the pristine properties of a porous dielectric layer, wherein the pristine properties have been altered by a process step, the method comprising providing a substrate with a layer of the processed porous dielectric on top, whereby the processed porous dielectric is at least partially exposed, forming a thin aqueous film at least on the exposed parts of the processed porous dielectric, and contacting the exposed porous dielectric having the aqueous film on the surface with an ambient containing a mixture comprising at least one silylation agent and dense $CO_2$, thereby restoring and preserving the pristine properties of the porous dielectric.

In one embodiment, the ambient can comprise liquid $CO_2$. Preferably this ambient is at room temperature.

In another embodiment the ambient can comprise supercritical $CO_2$ at a temperature higher than 31.1° C. and a pressure higher than 73.8 atm.

In another embodiment the thin aqueous film is formed upon bringing the processed porous dielectric in an atmosphere with predetermined humidity.

In yet another embodiment, the humidity of the atmosphere is between 40% and 50%. In a preferred embodiment this atmosphere with predetermined humidity is the clean room environment.

In any of the embodiments of the $1^{st}$ aspect, the thickness of the thin aqueous film is about 1 nm.

In another embodiments of the $1^{st}$ aspect, the process step is a chemical mechanical polishing (CMP).

In a further embodiment, the CMP step is performed without a metal hard mask overlying the porous dielectric.

In yet another embodiment, the CMP step is performed with a metal hard mask overlying the porous dielectric.

In another embodiment, the process step is a plasma processing.

The porous dielectric may be a CVD or a spin-on low-κ or ultra low-κ material.

In various embodiments, the silylation agent can be a chloroalkyl-silane ($SiCl_x(Alkyl)_{4-x}$) or a chloroalkyn-silane ($SiCl_x(Alkyn)_{4-x}$) with x being an integer between 1 and 3, or any of their mixtures.

In a preferred embodiment, the silylation agent is a trichloroalkyl-silane or a trichloroalkyn-silane or any of their mixtures.

A thermal anneal can be performed prior to forming the aqueous film on the processed porous dielectric. This thermal anneal is preferably performed at a temperature below 300° C.

An in-situ rinsing step can be performed after contacting the porous dielectric with the silylation agent. Preferably this rinse comprises dense $CO_2$ and an alcohol. An ex-situ rinsing step can be performed after contacting the porous dielectric with the silylation agent. Preferably this rinse comprises isopropyl alcohol and deionized water.

The present disclosure further describes a device with restored and preserved properties of a porous dielectric. In such a device, the pristine properties of the porous dielectric have been altered by a process step. The device comprising a porous dielectric layer and a sealing layer overlaying this porous dielectric layer, wherein the sealing layer consists of $Si_xC_yO_z$, with x, y, z being real numbers, and (x+y+z)=1.

In one embodiment of such a device, the device comprises a single damascene or a dual damascene stack comprising the porous dielectric layer, wherein the sealing layer is formed on the top of the exposed polished porous dielectric.

DETAILED DESCRIPTION

Figure 1:
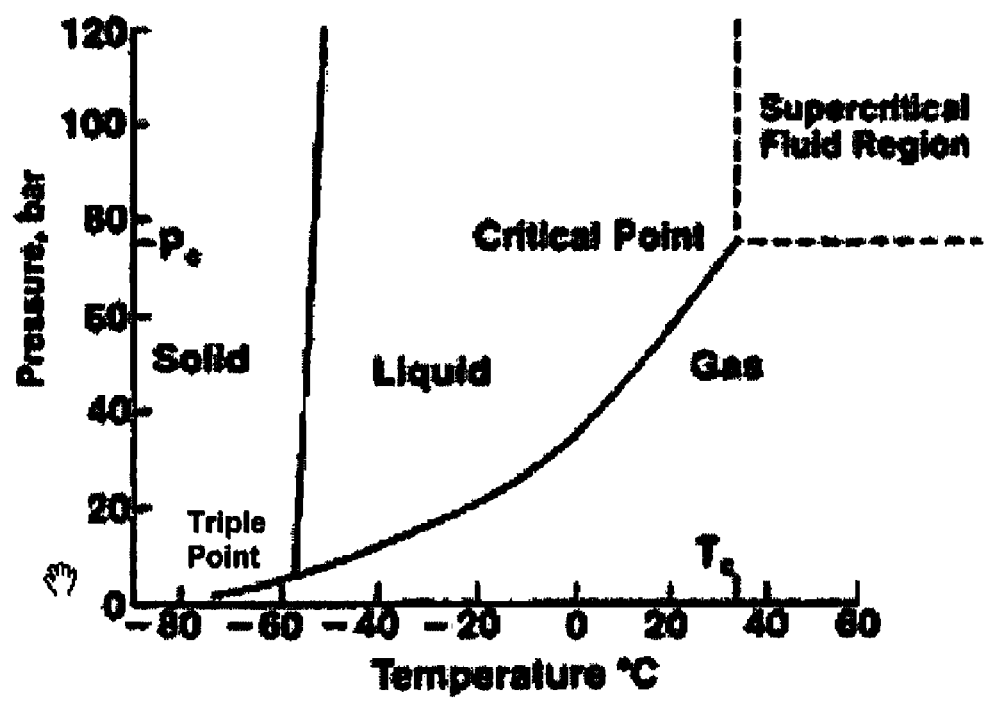
FIG. 1 shows the phase diagram of $CO_2$.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may do so. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practised without these specific details. In other instances, well-known methods, structures and techniques have not been shown in detail in order not to obscure an understanding of this description.

The following terms are provided solely to aid in the understanding of the different embodiments of this invention.

The term substrate may refer to a semiconductor material such as silicon or other materials used in semiconductor processing (Ge, III-V materials etc), or an insulating substrate of which glass or quartz are only two examples.

LOW-κ materials are insulators with a dielectric constant K lower than the κ-value for silicon dioxide (~4.0-4.2). These materials were introduced for the first time in the back-end-of-line (BEOL) processing to improve interconnects performance, more specific to reduce the resistance-capacitance the (RC) delay. Porous dielectrics gain attention as low-κ material to allow further reduction of the dielectric constant of the interlayer dielectric material. Nowadays, such porous dielectric are widely spread materials with potentially applications also in the front-end-of-line (FEOL) processing, where electrical coupling between conducting regions is to be reduced, e.g. as isolator for the STI (shallow trench isolation) areas.

Porosity of a low-κ material is a measure of the void spaces (pores) in the material, and is measured as a fraction of a unit volume, between 0-1, or as a volume percentage between 0-100%.

A high porosity low-κ material is a dielectric material with a porosity higher than 25% and more preferably higher than 30%. Such high porosity materials are also known as ultra low-κ (ULK) porous dielectric as they can have a relative dielectric constant of 2.5 of lower.

The term "pristine properties" is used to refer to the initial (as-deposited) electrical, chemical and physical properties of a porous dielectric, prior to any processing step. The pristine properties are defined by the κ-value, $H_2O$ contact angle (CA) as a measure of the pristine hydrophobicity, porosity, etc. During the subsequent processing steps these pristine properties can be altered ending up with different values. These values are known as integrated or effective properties (e.g. integrated κ-value or effective κ).

Contact angle measurements on ULK dielectrics were done at room temperature with deionised water as solvent to follow the changes in hydrophobicity at each step of the process.

In embodiments of the present application the term "dense $CO_2$" (abbreviated d-CO2) is used to designate both liquid and supercritical $CO_2$. As shown in the phase diagram (FIG. 1, from reference 'The Essence of Chromatography', Colin F. Poole, Elsevier, 2002, p. 571.) liquid $CO_2$ is defined within a certain temperature-pressure domain above the triple point (−56.6° C., 5.11 atm), the domain including the room temperature. Supercritical $CO_2$ is defined within an adjacent different temperature-pressure domain, above the critical point (31.1° C., 73.8 atm).

In a first aspect of the current patent application a method is disclosed to restore and preserve the pristine properties of a porous dielectric, whereby these pristine properties have been altered by a process step, the method comprising:
- providing a substrate with a layer of the processed porous dielectric on top, whereby the processed porous dielectric is at least partially exposed,
- forming a thin aqueous film at least on the exposed parts of the processed porous dielectric, and
- contacting the exposed parts of porous dielectric having the aqueous film on the surface with an ambient containing a mixture comprising at least one silylation agent and dense $CO_2$.

Optionally a thermal anneal step can be applied prior to forming the aqueous layer to remove the bulk damage of the processed porous layer.

Optionally a rinse step can be applied after contacting the exposed parts of the processed porous dielectric covered with an aqueous film with an ambient containing a mixture comprising at least one silylation agent and dense $CO_2$. This rinse step can be applied in the same process chamber as the silylation treatment (in-situ) or in a separate process chamber (ex-situ).

Figure 2:
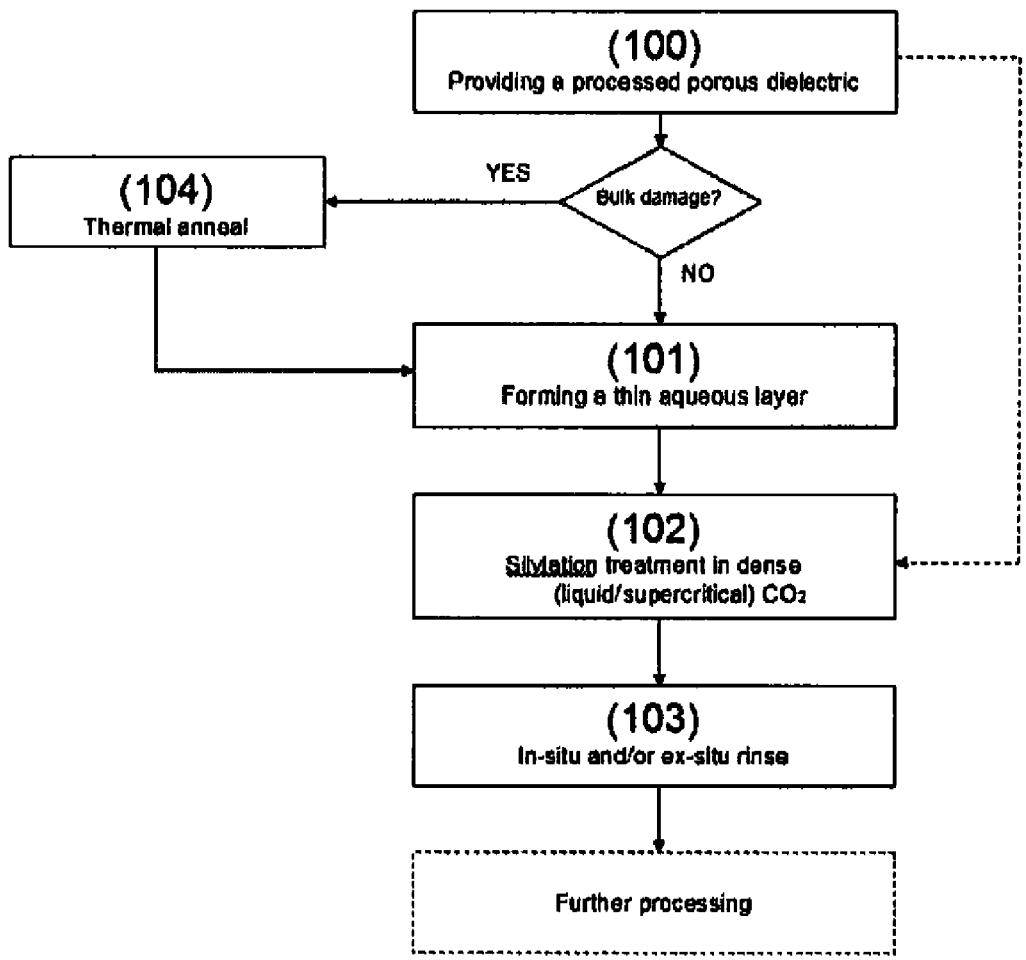
FIG. 2 shows is a process flow chart illustrating steps in a method of treating a porous dielectric.

FIG. 2 shows schematically the subsequent steps of this method in a process flow chart.

In a first embodiment of this method, a processed porous dielectric (100) is provided. The porous dielectric can be an ultra low-κ material, deposited either by spin-on deposition or by plasma enhanced chemical vapor deposition (PECVD) techniques. The spin-on material can be
(1) an organosilicate glass (OSG), or
(2) a nano clustered silica (NCS).

The later belongs to the broader class of hybrid materials with the general formula SiOxCyHz, with x+y+z=1 and x, y, z being real numbers, generically called MSQ (methyl silsesquioxanes). The PECVD deposited materials belong to the class of organosilicate glass, also known as carbon doped oxides (CDO).

The process step altering/deteriorating the pristine properties of the porous dielectric can be a chemical mechanical polishing (CMP) process, a plasma reactive etching, a plasma ashing, or any other plasma treatment, a post-CMP cleaning treatment etc. These alternatives will be discussed in detail in further embodiments and examples.

Degradation of the pristine properties of porous dielectric can take place either during processing or after processing during storage, queue time etc., when the processed material come into contact with the clean room environment and/or the micro-environments in the process tools. The post processing degradation is commonly known as ageing of the porous material.

Preserving the restored properties of a porous dielectric refers to preventing post processing degradation (ageing).

In another embodiment of this method a thin aqueous film (101) is formed at least on the exposed parts of the processed porous dielectric by contacting the processed porous dielectric with an ambient having a predetermined humidity. Preferably the humidity of the ambient is within 40% and 50%.

Upon bringing the processed porous dielectric in contact with an atmosphere having a predetermined humidity within 40% and 50%, a thin aqueous film with a film thickness of about 1 monolayer, is formed on the surface, at least on the exposed parts of the processed porous dielectric.

Advantageously, the thin aqueous film is formed by contacting the processed porous dielectric with a cleanroom ambient, having these predetermined humidity conditions. By transferring the processed dielectric from the previous process step, altering the pristine properties, to the tool where the silylation takes place, one can have the aqueous film formed on the exposed surface dielectric.

In a further embodiment of this method, the processed porous dielectric with the aqueous film on top is contacted with a mixture (102) comprising at least one silylation agent and liquid $CO_2$ at room temperature.

By reacting the thin water film on the exposed parts of the processed porous dielectric with the silylation agent in dense $CO_2$ a sealing layer is formed. This layer is a thin two dimensional cross-linked polymer and may be the result of two competitive mechanisms: (1) polycondensation of the sealing agent with adsorbed water molecules (bonding) on top of the porous dielectric surface and (2) the reaction of the silylation agent with surface silanols. This might explain both the recovering of the pristine hydrophobicity (water contact angle) and the stability of the recovered properties in time due to the sealed surface.

The silylation agent can be any chloroalkyl-silane ($SiCl_x$ $(Alkyl)_{4-x}$), or chloroalkyn-silane ($SiCl_x(Alkyn)_{4-x}$), with x being an integer between 1 and 3, or any of their mixtures. The alkyl- and alkyn-groups can be either hydrocarbons or fluorinated hydrocarbons. More preferably, the silylation agent can be any trichloroalkyl-silane, or trichloroalkyn-silane, or any of their mixtures. Typical examples are trichloroethylsilane (TCES), trichloromethylsilane (TCMS).

The volume concentration of the silylation agent needed to form a good sealing layer depends on the dimensions of the sample, the total surface of exposed processed dielectric and the type of silylation agent used. The minimum volume concentration is determined by the amount of silylation agent needed to form a thin sealing (polymer) layer on the surface of the exposed processed dielectric. The maximum volume concentration is determined by the solubility limit of the silylation agent in dense $CO_2$, or in a mixture of dense $CO_2$ and a co-solvent. As shown in a further embodiment, in our experimental configuration, the preferred volume concentration is 1.2% TCMS in dense $CO_2$.

In order to form a thin sealing layer, preferably a stoichiometric ratio $H_2O$:silylation agent (x:y) is needed, where x and y depends on the silylation agent and the thickness of the sealing layer to be formed. In the case of TCMS the best results are obtained for x=3 and y=1.

An excess of water on the surface of the processed dielectric (e.g. ambient humidity higher than 50%) could cause the formation of polymer particles on the surface upon silylation. Moreover the excess of water could stay in the pores of the porous dielectric, which would lead to an increase of the κ-value.

Using room temperature is advantageously since the experimental set-up does not require heating facilities and there are less safety concerns. Moreover using room temperature is also beneficial for the sealing process, since, due to this relatively low temperature, the water film will remain on the surface of the processed dielectric long enough to react with the silylation agent and form the thin sealing film. At higher temperatures the water concentration on the surface might get too low.

In yet another embodiment of the method, the processed porous dielectric with the aqueous film on top is contacted with a mixture (102) comprising at least one silylation agent and supercritical $CO_2$. Preferably the temperature of the supercritical $CO_2$ is between 31° C. and 200° C., more preferably between 40° C. and 90° C. The pressure of the supercritical $CO_2$ is between 74 atm and 500 atm, more preferably between 90 atm and 120 atm.

A co-solvent can be used to enhance the solubility of the silylation agent in dense $CO_2$. This co-solvent does not play an active role in the silylation reaction, more specifically does not interact with the water and/or the silanol groups on the surface of the processed dielectric. Drying the surface of the processed porous dielectric and/or blocking the silanol groups on the surface hinder the formation of the sealing layer and have to be avoided. Examples of compatible co-solvents can be: toluene, hexane, dodecane or any other solvent that fulfils the above mentioned requirements. Usually, the silylation agent and the co-solvent are added at the same time to dense $CO_2$ in a pre-mixing autoclave, prior to the contact with the porous dielectric.

In a further embodiment of the method, a thermal anneal (104) step can be performed optionally prior to the aqueous film formation. The thermal anneal desorbs the adsorbed water and organics in the bulk of the processed porous dielectric. After anneal the surface is not sealed and still hydrophilic, therefore a thin layer of water/moisture forms very quickly on the top surface.

Advantageously, the anneal temperature is kept below 300° C. to avoid surface dehydroxylation. A layer with a dehydroxylated surface is less prone to $H_2O$ adsorption, hindering in this way the formation of the thin aqueous film.

In another embodiment of the method a post-silylation rinse (103) is performed to assure compatibility with the further processing steps. The rinse can be done typically in two steps:

(1) in-situ rinse of the sealed porous dielectric with dense $CO_2$ or a mixture of dense $CO_2$ and a rinsing solvent, after silylation. This rinse will remove the excess silylation agent (e.g. TCMS) and reaction products (e.g. HCl). Typical examples of rinsing solvents showing good solubility in dense $CO_2$ are alcohols like ethanol, methanol, isopropanol, butanol etc.

(2) ex-situ rinse of the sealed porous dielectric with a sequence of rinsing liquids comprising an alcohol, an organic solvent (toluene, acetone) and de-ionized water. The ex-situ rinse can comprise the sequence isopropyl alcohol (IPA)/de-ionized water (DIW)/IPA and $N_2$ blow dry. This rinse will remove the un-reacted silylation agent (e.g. TCMS), as well as reaction products left on the surface and possible polymer-particles, formed by polymerization of the excess silylation agent.

By performing this two-step rinse or at least one of the rinsing steps, a clean surface compatible with further processing is achieved.

In a preferred embodiment of the method, the pristine properties of a processed ULK dielectric, altered by a chemical mechanical polishing process, are restored by performing a silylation treatment at room temperature in liquid $CO_2$. Furthermore, by this silylation treatment the restored properties are preserved against further degradation (ageing).

The ULK dielectric is a NCS material with the general formula SiOxHyCz and the atomic composition: 20% Si, 35% O, 31% H and 11.5% C. Further, NCS has a pristine κ-value of 2.35, is hydrophobic with a water contact angle of 91.4±2.2° and a pristine porosity of 30%. These pristine properties are altered by a chemical mechanical polishing (CMP) process. More specifically, the CMP process is a barrier-CMP in the single damascene or dual damascene process flow.

Damascene refers to the process by which a metal pattern is embedded within a dielectric material. In dual damascene the process sequentially creates embedded vias (holes) and trenches, with the vias forming the vertical connections from one layer of circuitry (trenches) to the next. Etching the vias and trenches in the dielectric materials avoids difficulties associated with etching copper, instead filling the etched features with copper. The copper (Cu) filling is followed by a Cu-CMP step, stopping on the barrier metal and a barrier-CMP step stopping on the porous dielectric layer. In single damascene a sequence of dielectric layers deposition, patterning and metal-fill is applied to form either a via or a trench.

However, the possible applications of the method described in the current patent application are not limited to post damascene CMP treatments. Any other CMP step stopping on a porous dielectric, in the front-end-of-line or back-end-of-line processing may alter in the same way the porous dielectric pristine properties.

Figure 3:
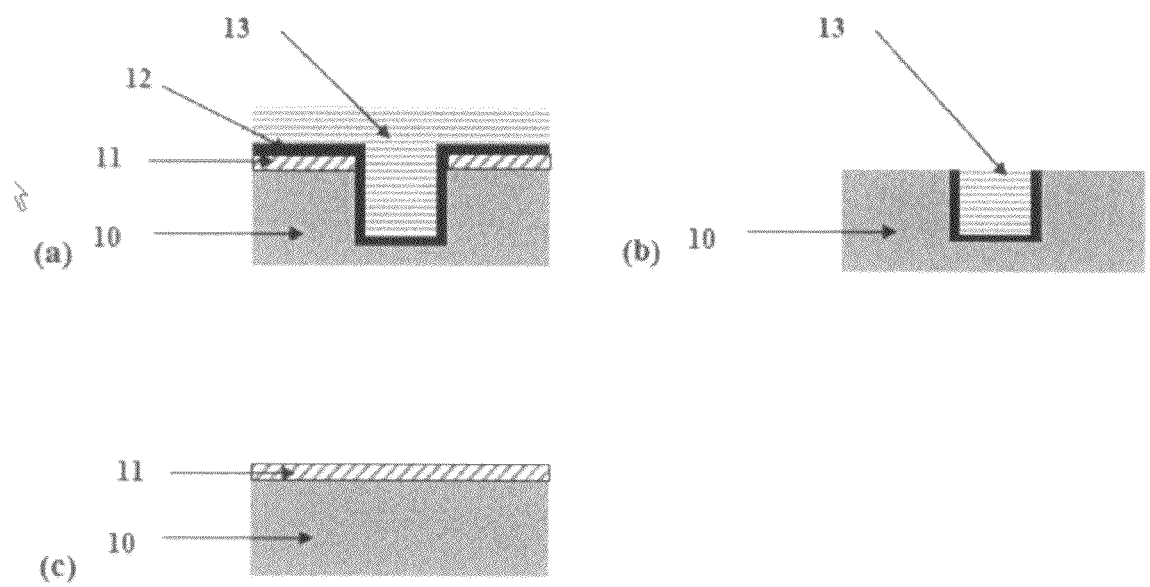
FIG. 3 shows (a) a typical single damascene stack before Cu and barrier CMP (b) a typical single damascene stack after Cu and barrier CMP (c) a non-patterned test stack with a metal hard mask.

A typical patterned stack (see FIG. 3(a)), used in the single damascene processing prior to Cu and barrier-CMP, comprises an ULK dielectric layer (10), optionally a dielectric protection layer (DPL) or a metal hard mask (MHM, e.g. TaN) layer (11), a diffusion barrier layer (e.g. TaN/Ta) (12) and a Cu filling (13). FIG. 3(b) represents a single damascene stack after Cu and barrier-CMP.

The non-patterned test stack (FIG. 3(c)) consists of an ULK dielectric layer (10) with the thickness of 400 nm, with or without a metal hard mask (50 nm TaN) (11) on top. Upon deposition, the stack is exposed to barrier-CMP processing and post-CMP clean on a LAM Teres linear polisher with integrated LAM Synergy brush cleaner. Two commercial slurries are used: an acidic slurry ($S_1$) with a pH of 2.5-3.0, and a basic slurry ($S_2$) with a pH of 9.5-11.0, combined with an acidic post-CMP cleaning solution. In various embodiments described herein SI slurry was used to illustrate the results of the silylation treatment on the processed ULK surface. However, the same results are obtained in case $S_2$ slurry is used at CMP.

Depending on the type of post-CMP dielectric damage, the silylation treatment can be performed either
  (a) immediately after CMP in case of surface damage alone, or
  (b) preceded by a thermal anneal to reduce bulk damage, and a step for forming a thin aqueous layer at least on the exposed parts of the porous dielectric in case of bulk and surface damage.

When the CMP step leads only to surface damage and a thin aqueous layer formation on the surface of the processed dielectric, the silylation treatment can be performed immediately upon CMP.

In case the CMP step leads to both surface and bulk damage by e.g. water and/or organic adsorption in the bulk of the processed dielectric, a thermal anneal step (104, FIG. 1) can be performed to restore the bulk properties. Preferably the temperature of the anneal step should be kept below 300° C. in order to prevent surface dehydroxylation.

When a thermal anneal is performed post-CMP, a thin aqueous layer on top of the processed dielectric should be formed prior to the silylation treatment.

In the best embodiment the thin aqueous layer is formed by exposing the annealed processed dielectric to the cleanroom environment having the humidity between 40% and 50%. In practice, the time interval needed to transfer the porous dielectric from the anneal tool to the silylation tool is enough to adsorb about 1 monolayer of water at least on the exposed parts of the processed dielectric.

The same experimental set-up is used both for the silylation treatment in liquid and supercritical $CO_2$. The silylation in liquid $CO_2$ is performed at room temperature, and a pressure between 110 atm and 120 atm. The silylation in supercritical $CO_2$ is performed at a temperature is between 40° C. and 90° C. and a pressure between 74 atm and 120 atm.

The silylation treatment is performed following the experimental procedure described in detail below:

1. Introduce a known amount of silylation agent in an autoclave at room temperature. In the preferred embodiment 6 ml pure liquid trichloromethylsilane (TCMS) are introduced in an autoclave with the volume of 500 ml (1.2 vol % TCMS).

2. Fill the autoclave with liquid $CO_2$, coming from the high pressure pump, up to a certain pressure P1 (P1>58 atm, which is the vapour pressure of $CO_2$ at room temperature) and stir the liquid to homogenize the mixture.

3. When working with the supercritical phase, higher temperatures and pressures can be obtained by switching on the heating lines around the autoclave; preferably the temperature is within 40° C. and 90° C. and the pressure between 110 atm and 120 atm.

4. Loading the substrate with the processed porous dielectric with the aqueous layer formed on top (sample) with an area of about 2 $cm^2$ in a reactor with a volume of about 15 ml.

5. Fill the reactor at room temperature with (part of) the mixture of the autoclave until a certain pressure P2 (P2>58 atm) is reached. In a preferred embodiment P2 is 110 atm.

6. Allow TCMS to contact the surface of the sample for at least few seconds. Preferably the contact time was between 10 minutes and 20 minutes. Static or dynamic conditions (stirring) may be used. Also, during the treatment there may be a (semi-)continuous flow of the liquid CO2 over the substrate.

7. Rinse the reactor dense $CO_2$ for at least 30 s. Typically 200 ml to 300 ml liquid $CO_2$ at 130 atm and room temperature was used.

8. Vent the reactor to atmospheric pressure and remove the sample.

9. Rinse the sample with isopropyl alcohol (IPA), de-ionized water (DIW), again IPA and blow dry with $N_2$ gun.

EXAMPLE 1

Silylation Treatment of NCS Dielectric After Direct-CMP

In case the metal hard mask or, more general, the dielectric protection layer is missing, one speaks about direct-CMP.

After direct-CMP (including a post-CMP clean), mainly the surface properties of the ULK dielectric are affected. More specific, a decrease in $H_2O$ contact angle (CA) to 46.7±2.7° and an increase in k-value with 0.3-0.4 is observed. The observations are consistent with a model in which a thin $H_2O$ layer (κ-value ~80) with an equivalent thickness of about 1-2 nm is present on top or inside the very first nanometers of the ULK film after direct-CMP.

In this case the silylation can be performed advantageously immediately after direct-CMP.

Table 1 shows the κ-value and contact angle for a NCS ULK film (polished with slurry $S_1$) after different post-CMP treatments, immediately after the treatment and after 10 days.

One can see that both the κ-value and the contact angle are better restored and preserved upon the treatment with TCMS and liquid $CO_2$.

TABLE 1

| Post-CMP treatment | κ-value | CA (°) | k-values after 10 days (ageing test) |
|---|---|---|---|
| ULK + CMP + annealing (300° C.) | >2.33 | 70.3 ± 0.5 | 2.51 |
| ULK + CMP + TCMS(liq) | 2.87 | 88.9 ± 2.0 | 2.71 |
| ULK + CMP + TMCS (liq) | 2.83 | 93.9 ± 0.7 | 2.53 |
| ULK + CMP + OTS(g) | >2.93 | 95.0 ± 0.7 | 2.56 |
| ULK + CMP + $UVO_3$ + $dCO_2$rinse + TCMS-$dCO_2$ | 2.67 | 100.5 ± 0.7 | 2.66 |
| ULK + CMP + $UVO_3$ + TCMS-$dCO_2$ | 2.42 | 103.7 ± 2.8 | 2.37 |

A post CMP thermal anneal lead to a recovery of the κ-value (~2.4) and partial recovery of the surface hydrophobicity (CA~70°), but the ageing tests show that the κ-value increases slowly after treatment. Upon 10 days after annealing the effective κ-value is again 2.51.

The use of organic silylation agents like trimethylchlorosilane (TMCS; $Me_3SiCl$), trichloromethylsilane (TCMS; $Cl_3SiMe$) in liquid phase (diluted in anhydrous dodecane 1:99) lead only to partial recovery in κ-value. After 1 hour immersion in TMCS (liq) solution, followed by manual rinsing and drying, the κ-value of processed ULK sample is about 2.8. The κ-value decreases with ageing time under ambient conditions and finally stabilizes around ~2.5-2.7.

Post-CMP treatments in gas phase with octadecyltrichlorosilane 97% (OTS; Me—$(CH_2)_{18}$-$SiCl_3$) at 140° C. lead to a very hydrophobic surface (CA>100°), but the measured stabilized κ-value is very high (~2.95), indicating that organic molecules with long carbonaceous backbone (high molecular weight) are less suitable for post-CMP silylation purposes.

Figure 4:
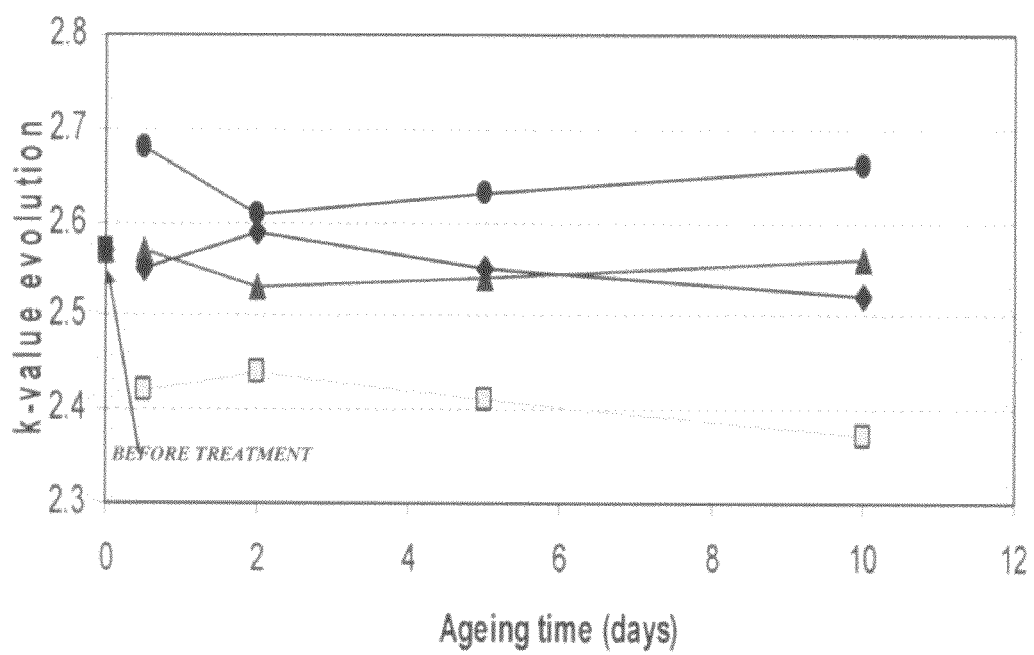
FIG. 4 shows the κ- value restoration and ageing behavior after post-CMP silylation treatment with TCMS in liquid $CO_2$ preceded by different treatments.

FIG. 4 shows the κ-value restoration for a NCS ULK dielectric and its ageing behavior after silylation with TCMS (1.2 vol %) and liquid $CO_2$, as function of the different pre-treatments: (1) dot=CMP+$UVO_3$+10 min dense-$CO_2$ rinse+TCMS-dense$CO_2$; (2) triangle=CMP+10 min dense-$CO_2$ rinse+TCMS-dense$CO_2$; (3) diamond=20 min $HNO_3$ rinse+10 min dense-$CO_2$ rinse+TCMS-dense$CO_2$; (4) square=CMP+$UVO_3$+TCMS-dense$CO_2$.

The dense-$CO_2$ rinse is an in-situ treatment performed under the same conditions (temperature, pressure) as the silylation treatment, in dense $CO_2$ without silylation agent for a time interval varying between 10 minutes and 30 minutes.

The $UVO_3$ clean is performed upon CMP to remove organic residues from the surface of the processed ULK dielectric. The $UVO_3$ clean is a photo-sensitized oxidation process, in which the excited/dissociated organic residues are removed by the reaction with atomic oxygen.

Among the different combinations above, option (4) marked with square (CMP+$UVO_3$+TCMS-dense$CO_2$) shows the best results in restoring the pristine κ-value and in preventing ageing degradation. The absence of the in-situ pre-treatment (dense $CO_2$ rinse) prior to silylation can explain the improvement. When performed in-situ, immediately before the silylation step, dense $CO_2$ rinse removes the adsorbed water (the thin aqueous film on the surface) and hinders the formation of the sealing layer.

Further tests, repeating the treatments shown in FIG. 4 without $UVO_3$ clean, confirmed that $UVO_3$ clean has little or no impact on the results.

The silylation treatment with TCMS in liquid $CO_2$ is particularly efficient in restoring the pristine surface hydrophobicity (CA~104° C.) and in maintaining the restored κ-value very low and stable even after 10 days (2.37). The later means that the surface of the porous dielectric is efficiently protected (sealed) against moisture/contamination uptake.

Porosity of ULK dielectrics is estimated by means of an Ellipsometric Porosity (EP) equipment recording changes in optical properties of the material during adsorption and desorption of an organic solvent (toluene).

Figure 5A:
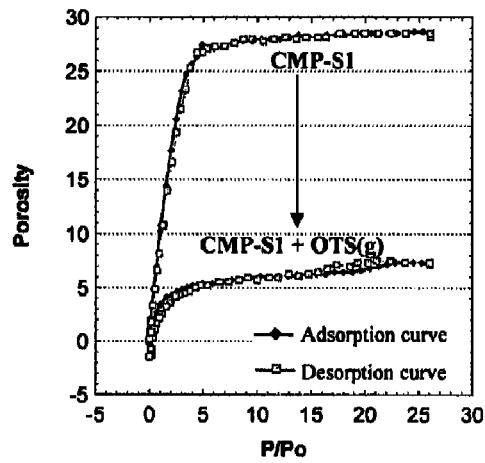
FIGS. 5(a)-(c) show the ellipsometric porosimetry (EP) measurements with toluene of the post-CMP (with slurry S1) processed ULK dielectric: (a) before and after OTS(g) treatment; (b) after the in-situ dense $CO_2$ rinse and TCMS (in dense $CO_2$) treatment; (c) after TCMS (in dense $CO_2$) treatment.
Figure 5B:
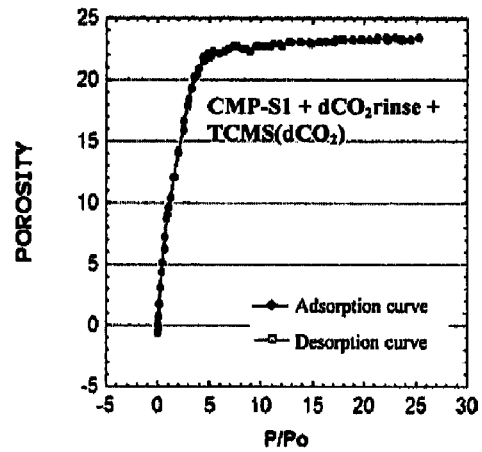
Figure 5C:
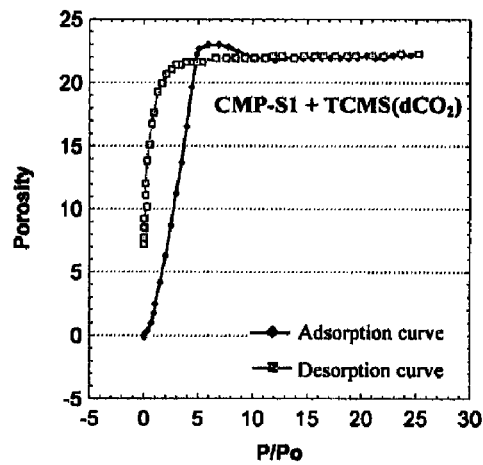

The EP measurements presented in FIGS. 5(a)-(c) show the impact of the silylation treatment on the NCS ULK porosity after (a) OTS(g) treatment of the post-CMP processed ULK dielectric; (b) in-situ dense $CO_2$ and TCMS (in dense $CO_2$) treatment of the post-CMP processed ULK dielectric; (c) TCMS (in dense $CO_2$) treatment of the post-CMP processed ULK dielectric.

As shown in FIG. 5(a) upon silylation treatment with OTS (g) a significant reduction in porosity takes place: from a pristine value of about 30% to a post-treatment value of about 8%. This result confirms that OTS(g) penetrates the ULK material during silylation and fills completely some of the pores.

FIG. 5(b) shows that in-situ dense $CO_2$ rinse followed by TCMS in dense $CO_2$ has a small impact on the NCS ULK porosity. A post-treatment value of about ~23% is obtained when the pristine value is about 30%. The perfect overlapping of the adsorption and desorption curves shows that surface pores are not blocked/covered. Consequently, there is no evidence of a sealing layer being formed to protect the ULK dielectric against further degradation, e.g. by water/moisture/organics adsorption in the bulk.

FIG. 5(c) shows that TCMS in dense $CO_2$ has also a small impact on the NCS ULK porosity. A post-treatment value of about ~23% is obtained when the pristine value is about 30%. The difference between adsorption and desorption curves shows that surface pores are at least partially blocked after the TCMS ($dCO_2$) treatment, confirming the formation of a sealing layer.

EXAMPLE 2

Silylation Treatments of NCS Dielectric After Metal Hard Mask CMP

Figure 6:
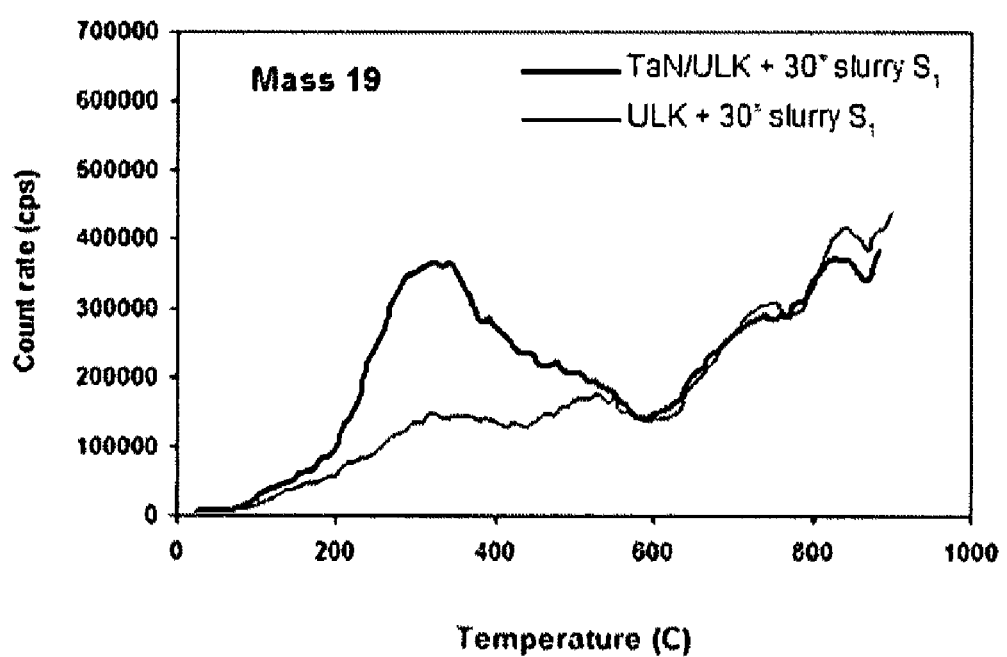
FIG. 6 shows the increased amount of physi- and chemisorbed $H_2O$ on polished TaN/ULK film by thermodesorption (TDS).

The presence of a metal hard mask (e.g. TaN) on top of the ULK dielectric leads to an even lower CA after CMP (~20°) and to an increased amount of physi- and chemisorbed $H_2O$ as shown in FIG. 6. Moreover, the presence of TaN leads to surface defects and/or metal contamination on the ULK dielectric surface, contributing further to ULK hydrophilization.

In this case of ULK dielectric covered with a MHM, the annealing step after CMP (300C, $N_2$ ambient) can improve substantially the k-value and CA recovery, by removing moisture and organic residues form the bulk of the processed dielectric.

Upon forming the thin aqueous layer by contacting the annealed processed dielectric with an ambient with predetermined humidity, the silylation treatment is performed as described in Example 1.

Despite the more important damage produced by the CMP-process, the silylation treatment with TCMS (1.2 vol %) and liquid $CO_2$ recovers the pristine CA (~91°) and k-value (2.3-2.4) of the NCS dielectric.

In a further embodiment of the method, the pristine properties of a processed ULK dielectric, altered by a plasma process, are restored by performing a silylation treatment in liquid or supercritical $CO_2$. Furthermore, by this silylation treatment the restored properties are preserved against further degradation (ageing).

Due to its marked anisotropic character, plasma processing creates mostly surface damage, the bulk properties of the ULK dielectric being only partially affected. In case bulk damage is present, this is mostly due to adsorbed gases and organic residues on the surface or in the pores. A typical plasma processing may be via or trench etch in the single or dual damascene process flow.

Therefore the method described herein is suitable to restore and preserve the pristine properties of an ULK layer altered by a plasma process. Prior to the silylation treatment, a thin aqueous layer is formed on at least the exposed parts of the etched dielectric, by exposing the processed (etched) dielectric to an atmosphere having the humidity between 40% and 50%. In practice, the atmosphere having the humidity between 40% and 50% can be a cleanroom environment and the time interval needed to transfer the porous dielectric from the etch tool to the silylation tool is enough to adsorb about 1 monolayer of water at least on the exposed parts of the processed dielectric.

Optionally, an anneal step in $N_2$ can be performed after etch to remove the adsorbed etch residues (organics, etch gases etc) in the bulk. The temperature of the anneal step should be preferably kept under 300° C.

A silylation treatment with 1.2% TCMS in liquid or supercritical $CO_2$ is performed on the etched dielectric, upon formation of the aqueous film, following the method of the best embodiment.

The pristine properties of an ULK dielectric altered by a CMP or a plasma process can be restored and preserved by a treatment with a silylation agent in liquid or supercritical $CO_2$. Each time the silylation step is preceded by the forming of a thin aqueous film on the surface of the processed porous dielectric. Optionally an anneal step can be performed prior to the aqueous layer formation.

In a second aspect of the current description, a device is disclosed with restored and preserved properties of a porous dielectric, whereby these pristine properties have been altered by a process step, the device comprising:
  a porous dielectric layer
  a sealing layer overlaying this porous dielectric layer characterized in that the sealing layer consists of $Si_xC_yO_z$, with x, y, z being real numbers and (x+y+z)=1.

Forming a sealing layer on the exposed surface of the processed porous dielectric protects the ageing degradation by blocking at least partially of the surface pores of the dielectric material. If the pores are blocked, bulk degradation due to moisture/organic contamination uptake cannot take place anymore. The partial blocking can be evidenced by ellipsometric porosimetry as shown in FIG. 5(c), where a clear difference between toluene adsorption and desorption curves appears.

In one embodiment, the device can comprise a single damascene, or a dual damascene stack or any other stack comprising a processed porous low-κ dielectric.

A single damascene stack after Cu and barrier CMP is represented in FIG. 3(b). After barrier-CMP the stack comprises a porous dielectric (10) and a trench in this porous dielectric filled with a conductive material (e.g. Cu) (13).

Upon the silylation treatment in dense $CO_2$, performed as in any of the methods described herein, a sealing layer is formed on top of the exposed processed (polished) dielectric. This sealing layer is formed selectively on the exposed polished dielectric, due to the presence of silanol groups on this surface.

The invention claimed is:

1. A method comprising:
   forming a layer of pristine porous dielectric on a substrate, wherein the layer of pristine porous dielectric has at least one pristine property;
   processing the layer of pristine porous dielectric to produce a layer of processed porous dielectric, thereby altering at least one of the at least one pristine properties;
   forming a thin aqueous film at least on an exposed portion of the layer of processed porous dielectric; and
   contacting the exposed portion of the layer of processed porous dielectric on which the aqueous film is formed with an ambient containing a mixture comprising at least one silylation agent and dense $CO_2$, thereby restoring and preserving the at least one altered pristine property.

2. The method of claim 1 wherein said ambient comprises liquid $CO_2$.

3. The method of claim 2 wherein said ambient is at room temperature.

4. The method of claim 1 wherein said ambient comprises supercritical $CO_2$ at a temperature higher than 31.1° C. and a pressure higher than 73.8 atm.

5. The method of claim 1 wherein said thin aqueous film is formed by bringing said processed porous dielectric into an atmosphere with predetermined humidity.

6. The method of claim 5 wherein the humidity of said atmosphere is between 40% and 50%.

7. The method of claim 5 wherein said atmosphere with predetermined humidity is a cleanroom environment.

8. The method of claim 1 wherein the thickness of the thin aqueous film is about 1nm.

9. The method of claim 1 wherein processing the layer of pristine porous dielectric comprises performing a chemical mechanical polishing (CMP).

10. The method of claim 9 wherein said CMP is performed without a metal hard mask overlying the porous dielectric.

11. The method of claim 9 wherein said CMP is performed with a metal hard mask overlying the porous dielectric.

12. The method of claim 1 wherein processing the layer of pristine porous dielectric comprises plasma processing.

13. The method of claim 1 wherein said porous dielectric is one of a chemical vapor deposition (CVD), a spin-on low-κ material, and an ultra low-κ material.

14. The method of claim 1 wherein said silylation agent is one of a chloroalkyl-silane ($SiCl_x(Alkyl)_{4-x}$), a chloroalkyn-silane ($SiCl_x(Alkyn)_{4-x}$), with x being an integer between 1 and 3, and any of their mixtures.

15. The method of claim 14 wherein x=3.

16. The method of claim 1 further comprising performing a thermal anneal prior to forming said aqueous film on said processed porous dielectric.

17. The method of claim 16 where the thermal anneal is performed at a temperature below 300° C.

18. The method of claim 1 further comprising an in-situ rinsing step with a mixture comprising dense $CO_2$ and an alcohol, after contacting the porous dielectric with the silylation agent.

19. The method of claim 1 further comprising an ex-situ rinsing step with isopropyl alcohol and deionized water, after contacting the porous dielectric with the silylation agent.

* * * * *